United States Patent
Ha

(10) Patent No.: US 8,829,577 B2
(45) Date of Patent: Sep. 9, 2014

(54) TRANSISTOR, IMAGE SENSOR WITH THE SAME, AND METHOD OF MANUFACTURING THE SAME

(75) Inventor: Man Lyun Ha, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 206 days.

(21) Appl. No.: 13/056,310

(22) PCT Filed: Sep. 29, 2009

(86) PCT No.: PCT/IB2009/007308
§ 371 (c)(1),
(2), (4) Date: May 4, 2011

(87) PCT Pub. No.: WO2010/035143
PCT Pub. Date: Apr. 1, 2010

(65) Prior Publication Data
US 2011/0210381 A1     Sep. 1, 2011

(30) Foreign Application Priority Data
Sep. 29, 2008   (KR) .................. 10-2008-0095461

(51) Int. Cl.
| H01L 31/062 | (2012.01) |
| H01L 27/146 | (2006.01) |
| H01L 29/78 | (2006.01) |
| H01L 29/66 | (2006.01) |
| H01L 29/10 | (2006.01) |

(52) U.S. Cl.
CPC .... *H01L 27/14609* (2013.01); *H01L 27/14612* (2013.01); *H01L 27/1463* (2013.01); *H01L 29/7835* (2013.01); *H01L 27/14689* (2013.01); *H01L 29/78* (2013.01); *H01L 29/66659* (2013.01); *H01L 29/1083* (2013.01)
USPC .................... 257/291; 257/E21.618; 438/174

(58) Field of Classification Search
USPC .......................... 257/291, E21.618; 438/174
See application file for complete search history.

(56) References Cited

U.S. PATENT DOCUMENTS

| 6,353,245 B1 * | 3/2002 | Unnikrishnan ............... 257/347 |
| 2005/0148114 A1 | 7/2005 | Rhodes |

(Continued)

FOREIGN PATENT DOCUMENTS

| CN | 1967857 | 5/2007 |
| EP | 0 596 468 | 5/1994 |
| EP | 0 683 531 | 11/1995 |
| JP | 02250331 | 10/1990 |

(Continued)

OTHER PUBLICATIONS

International Search Report and Written Opinion corresponding to International Patent Application No. PCT/IB2009/007308, mailed May 28, 2010.

*Primary Examiner* — Dale E Page
(74) *Attorney, Agent, or Firm* — McAndrews, Held & Malloy, Ltd.

(57) ABSTRACT

Provided is an image sensor including a drive transistor as a voltage buffer, which can suppress generation of secondary electrons from a channel of the drive transistor to prevent generation of image defects caused by dark current. The transistor includes a gate electrode formed on a substrate, source and drain regions formed in the substrate exposed to both sides of the gate electrode, respectively, and an electric field attenuation region formed on the drain region and partially overlapping the gate electrode.

18 Claims, 5 Drawing Sheets

(56) References Cited

U.S. PATENT DOCUMENTS

| | | |
|---|---|---|
| 2006/0040450 A1 | 2/2006 | Hsu |
| 2006/0151817 A1* | 7/2006 | Lee .............................. 257/291 |
| 2007/0272981 A1 | 11/2007 | Ha |

FOREIGN PATENT DOCUMENTS

| | | |
|---|---|---|
| JP | 04269836 | 9/1992 |
| JP | 2006093520 | 4/2006 |
| JP | 2007318093 | 12/2007 |

* cited by examiner

TRANSISTOR, IMAGE SENSOR WITH THE SAME, AND METHOD OF MANUFACTURING THE SAME

CROSS-REFERENCE TO RELATED APPLICATIONS

The present application is a 35U.S.C. §371national stage filing of PCT Application PCT/IB2009/007308, filed Sep. 29, 2009, which claims priority to KR Application 10-2008-0095461, filed Sep. 29, 2008. Each of the above-dentified applications are incorporated herein by reference in their entirety.

DETAILED DESCRIPTION

1. Technical Field

The present invention relates to a semiconductor manufacturing technology, and more particularly, to an image sensor and a method of manufacturing the same, more specifically, a CMOS image sensor and a method of manufacturing the same.

2. Background Art

Image sensors are semiconductor devices configured to convert an optical image into an electrical signal, which are classified into a charge coupled device (CCD) and a complementary metal-oxide semiconductor (CMOS) image sensor.

Most of unit pixels of the CMOS image sensor have a 3-Tr structure or a 4-Tr structure. The 3-Tr structure or the 4-Tr structure includes a source follower transistor (hereinafter, referred to as a drive transistor) acting as a voltage buffer, different from a 1-Tr structure.

FIG. 1 is an equivalent circuit diagram of a unit pixel of a conventional 4-Tr structure. FIG. 2 is a cross-sectional view showing a photo diode as a photo detection device, a transfer transistor, a floating diffusion region, and a drive transistor of the unit pixel of FIG. 1.

Referring to FIGS. 1 and 2, the unit pixel includes one photo diode PD, and four transistors. The four transistors include a transfer transistor Tx configured to convey a photo-generated charge gathered from the photo diode PD to a floating diffusion region FD, a reset transistor Rx configured to set a potential of the floating diffusion region FD to a desired value and reset the floating diffusion region FD, a drive transistor Dx operated according to charges accumulated in the floating diffusion region FD to act as a voltage buffer constituted by a source follower, and a select transistor Sx configured to perform addressing through switching.

However, such a CMOS image sensor has a problem that charge transmission efficiency and charge storage capability are decreased due to dark current to cause image defects. The dark current means charges accumulated in a photo detection device of the CMOS image sensor without input of light. The dark current is known to be caused by various defects or dangling bonds existing on the surface of the silicon substrate.

In addition, one of the causes of the dark current may be a symmetrical structure of the drive transistor Dx. A drain D and a source S of the drive transistor Dx have a symmetrical structure with respect to a gate G, similar to the conventional transistor. Upon driving a pixel in this structure, a relatively high level of power voltage is applied to the drain D of the drive transistor Dx from a power voltage terminal, and a voltage corresponding to charges accumulated in the floating diffusion region FD, i.e., a voltage frequently varied according to external light is applied to the gate D. As a result, a high potential is generated between the drain D and the gate G, and a hot carrier as a secondary electron is generated in a channel of the drive transistor Dx due to a high electric field caused by the high potential. Such a hot carrier is introduced and accumulated in the floating diffusion region FD and the photo diode PD to cause image defects such as color or white dots on a screen as if an image were photographed, even though no image is photographed.

DISCLOSURE OF THE INVENTION

Problems to be Solved by the Invention

Therefore, the present invention is provided in order to solve the problems of the conventional art, and objects of the invention as follows.

First, the present invention provides a transistor capable of reducing noise elements caused by a hot carrier generated due to a high electric field between a gate and a drain of the transistor.

Second, the present invention provides a method of manufacturing a transistor capable of reducing noise elements caused by a hot carrier generated due to a high electric field between a gate and a drain of the transistor.

Third, the present invention provides an image sensor including a drive transistor as a voltage buffer and capable of suppressing generation of a secondary electron in a channel of the drive transistor to prevent generation of image defects due to dark current.

Fourth, the present invention provides a method of manufacturing an image sensor including a drive transistor as a voltage buffer and capable of suppressing generation of a secondary electron in a channel of the drive transistor to prevent generation of image defects due to dark current.

Solutions to Solve the Problems

In order to solve the problems, an exemplary embodiment of the present invention provides a transistor including: a gate electrode formed on a substrate; and source and drain regions formed in the substrate exposed to both sides of the gate electrode, respectively, wherein a portion of the drain region is expanded to the source region to overlap the gate electrode.

In order to solve the problems, another exemplary embodiment according to the present invention provides a transistor including: a gate electrode formed on a substrate; source and drain regions formed in the substrate exposed to both sides of the gate electrode, respectively; and an electric field attenuation region formed on the drain region and partially overlapping the gate electrode.

In order to solve the problems, still another exemplary embodiment according to the present invention provides an image sensor including: a transfer transistor configured to transmit photo charges gathered in a photo detection device to a floating diffusion region; a reset transistor configure to set or reset a potential of the floating diffusion region to a desired value; a drive transistor constituted as a transistor having a gate electrode connected to the floating diffusion region and a drain region connected to a power voltage terminal, and operated according to charged accumulated in the floating diffusion region; and a select transistor configured to transmit a signal output from the source region of the drive transistor.

In order to solve the problems, another exemplary embodiment according to the present invention provides a method of manufacturing a transistor including: forming a first doping region for source and drain regions formed in a substrate and spaced apart from each other; forming a gate electrode on the substrate to overlap a portion of the first doping region for the drain region; and forming a second doping region for the source and drain regions under the first doping region exposed to both sides of the gate electrode.

In order to solve the problems, further another exemplary embodiment according to the present invention provides a method of manufacturing a transistor including: forming an electric field attenuation region on an interface of a substrate; forming a gate electrode on the substrate to overlap a portion of the electric field attenuation region; and forming source and drain regions under the electric field attenuation region exposed to both sides of the gate electrode.

In order to solve the problems, still further another exemplary embodiment according to the present invention provides a method of manufacturing an image sensor including a transistor constituted by a source follower including: forming an electric field attenuation region on an interface of a substrate at a region in which the transistor is formed; forming a gate electrode on the substrate to overlap a portion of the electric field attenuation region; and forming source and drain regions under the electric field attenuation region exposed to both sides of the gate electrode.

Effects

As can be seen from the foregoing, a relatively low concentration of doping region may be formed on the drain region of the drive transistor to overlap a portion of the gate electrode. As a result, it is possible to attenuate a high electric field applied to the drain region, and thus, reduce generation of secondary electrons and light in a visible light band, preventing generation of image defects.

DETAILED DESCRIPTION OF THE INVENTION

The present invention will now be described more fully hereinafter with reference to the accompanying drawings, in which preferred embodiments of the invention are shown. In the drawings, the thickness and the gap of layers and regions may be exaggerated for clarity. In addition, when a layer is described as being formed on another layer or substrate, the layer may be formed directly on the other layer or substrate, or a third layer may be interposed between them. Like reference numerals designate like elements throughout the specification.

Embodiment 1

FIG. 3 is a cross-sectional view of a transistor in accordance with a first exemplary embodiment of the present invention. In a unit pixel of the CMOS image sensor, only four elements, i.e., a photo detection device 109, a transfer transistor Tx, a floating diffusion region 113, and a drive transistor Dx are shown.

Referring to FIG. 3, the transistor in accordance with a first exemplary embodiment of the present invention is the drive transistor Dx, which includes a gate electrode 107 formed on a substrate 100, and source and drain regions 111 and 112 formed in the substrate exposed to both sides of the gate electrode 107, respectively.

The source and drain regions 111 and 112 have an asymmetrical structure. That is, the drain region 112 is partially expanded to the source region 111 to overlap the gate electrode 107 (see a portion A of FIG. 3). The source region 111 is aligned with the gate electrode 107, not overlapping the gate electrode 107.

The drain region 112 is formed at an interface of the substrate 100, and includes a first doping region 104 partially overlapping the gate electrode 107, and a second doping region 110 spaced apart from the gate electrode 107 and formed under the first doping region 104. The first doping region 104 has a lower concentration than that of the second doping region 110. The first and second doping regions 104 and 110 have the same conductivity type.

The source region 111 is formed at an interface of the substrate 100, and includes a first doping region aligned with the gate electrode 107, and a second doping region 110 spaced apart from the gate electrode 107 and formed under the first doping region 104. The first doping region 104 has a lower concentration than that of the second doping region 110. The first and second doping regions 104 and 110 have the same conductivity type.

The transistor in accordance with a first exemplary embodiment of the present invention further includes a third doping region 103 formed under the first doping region 104 of the source and drain regions 111 and 112. The third doping region 103 is a halo region, and has a conductivity type different from the first and second doping regions 104 and 110. For example, when the transistor is formed of a n-type metal-oxide semiconductor (NMOS) and the first and second doping regions 104 and 110 are an n-type, the third doping region 103 is a p-type.

FIGS. 4A and 4B are cross-sectional views showing a method of manufacturing the transistor shown in FIG. 3.

First, as shown in FIG. 4A, an isolation layer 102 is formed, in the substrate 100.

The substrate 100 is a semiconductor substrate, which may be a bulk substrate or a silicon on insulator (SOI) substrate. Preferably, the SOI substrate having good interference characteristics is used.

The isolation layer 102 may be formed through local oxidation of silicon (LOCOS) or shallow trench isolation (STI). Preferably, the STI advantageous to high integration is used. The isolation layer 102 is formed of an oxide layer-based material, for example, a high density plasma (HDP) oxide layer.

Then, a well 101 is formed in the substrate 100. For example, when the transistor is formed of an NMOS, a P well is formed, and when the transistor is formed of a PMOS, an N well is formed. Here, the P well is formed.

The step of forming the well 101 is not limited. For example, the well 101 may be formed before forming the isolation layer 102 or after forming the isolation layer 102.

Next, the third doping region 103 may be formed in the well 101 to act as a halo region. The third doping region 103 is formed between the source and drain region 111 and 112. Specifically, the third doping region 103 is formed under a region in which a channel (not shown) is to be formed. More specifically, the third doping region 103 is formed under the first doping region 104. The third doping region 103 is formed as p-type conductivity.

Then, an ion implantation mask is formed to partially expose a region in which the drive transistor Tx of the CMOS image sensor is to be formed, specifically, a region in which the source and drain regions 111 and 112 and the channel are to be formed. An ion implantation process using the ion implantation mask is performed to form the first doping region 104 on the interface of the substrate 100. The first doping region 104 is formed as n-type conductivity. Specifically, the first doping region 104 is formed at a relatively low level of implantation energy using a group III material such as phosphors P or n-type impurities such as arsenic As. More specifically, the first doping region 104 is formed at the interface of the substrate 100 with a low level of ion implantation energy $1\times10^{12}$ to $1\times10^{13}$ ions/cm$^2$ dose using arsenic ions that can be easily ion-implanted.

Next, as shown in FIG. 4B, the gate electrode 107 is formed on the substrate 100. In the CMOS image sensor, when the unit pixel is formed of a 4-Tr structure as shown in FIG. 1, gate electrodes of the transistors Tx, Rx, Dx and Sx are simultaneously formed.

The gate electrode 107 of the drive transistor Dx is formed to partially overlap the first doping region 104 of the drain region 112. That is, the doping region 104 of the drain region 112 is disposed under the gate electrode 107 of the drive transistor Dx. On the other hand, the gate electrode 107 is formed not to overlap the first doping region 104 of the source region 111. That is, the first doping region 104 of the source region 111 is aligned with the gate electrode 107.

The gate electrode 107 is formed of a gate insulating layer 105 and a gate conductive layer 106. The gate insulating layer 105 is formed of a silicon oxide layer. The gate conductive layer 106 is formed of a polysilicon layer or a stack structure of a polysilicon layer and a metal silicide layer. For example, the metal silicide layer is formed of a tungsten silicide layer or a cobalt silicide layer.

For example, describing a method of forming the gate electrode 107, first, a silicon oxide layer is formed on the substrate 100 through an oxidation process. Then, after depositing a polysilicon layer on the silicon oxide layer, the polysilicon layer and the silicon oxide layer are etched to form the gate electrode 107.

Next, the photo detection device 109 is formed. The photo detection device 109 is formed in the substrate 100 exposed to one side of the gate electrode 107 of the transfer transistor Tx. The photo detection device 108 is aligned with the gate electrode 107 of the transfer transistor Tx. The photo detection device 109 may be formed of a hole accumulated device (HAD) or a pinned photo diode (PPD) structure.

Next, spacers 108 may be formed at both sidewalls of the gate electrode 107. The spacers 108 may be formed before formation of the photo detection device 109. The spacers 108 may be formed of an oxide layer, or a stack structure of an oxide layer and a nitride layer.

Next, the second doping region 110 of the source and drain region 111 and 112 is formed in the substrate 100 exposed to both sides of the gate electrode 107. When the spacers 108 are formed, the second doping region 110 is formed in the substrate 100 exposed to the exterior, not being covered by the spacers 108.

The second doping region 110 is simultaneously formed in the substrate 100 exposed to both sides of the gate electrodes of the transistors Dx, Rx and Sx of the CMOS image sensor in which the unit pixel has a 4-Tr structure. Of course, the second doping region 110 is also formed in the substrate 100 exposed to one side of the gate electrode of the transfer transistor Tx, except the region in which the photo detection device 109, i.e., a photo diode is formed. The second doping region formed in the transfer transistor Tx functions as the floating diffusion region 113.

Since the second doping region 110 is formed using the ion implantation mask to cover the region, in which the photo diode is to be formed upon the ion implantation process, together with the gate electrode 107, as an ion implantation mask, the second doping region 110 is aligned with the gate electrode 107. When the spacers 108 exist, the second doping region 110 is aligned with the spacers 108. The second doping region 110 is formed of the same conductivity type as the first doping region 104, i.e., n-type conductivity. The second doping region 110 is formed to have a larger depth and higher concentration than the first doping region 104 using a higher level of ion implantation energy and a larger amount of dose than the ion implantation process of the first doping region 104.

Embodiment 2

FIG. 5 is a cross-sectional view of a transistor in accordance with a second exemplary embodiment of the present invention. Here, only four elements, i.e., a photo detection device 209, a transfer transistor Tx, a floating diffusion region 214, and a drive transistor Dx are shown.

Referring to FIG. 5, the transistor in accordance with a second exemplary embodiment of the present invention includes a gate electrode 207 formed on a substrate 200, source and drain regions 212 and 213 formed in the substrate 200 exposed to both sides of the gate electrode 207, respectively, and an electric field attenuation region 204 formed on the drain region 213 (an interface of the substrate) and partially overlapping the gate electrode 207.

The drain region 213 is aligned with the gate electrode 207, and includes a first doping region 208 formed under the electric field attenuation region 204, and a second doping region 211 spaced apart from the gate electrode 207 and formed under the first doping region 208. The first doping region 208 has a lower concentration than that of the second doping region 211, and a higher concentration than that of the electric field attenuation region 204.

The electric field attenuation region 204 is formed to have the same conductivity type as the first and second doping regions 208 and 211, for example, n-type conductivity. The electric field attenuation region 204 is shallower than the first doping region 208, and has a lower concentration than that of the first doping region 208.

The source region 212 is formed at an interface of the substrate 200, and includes a first doping region 208 aligned with the gate electrode 207, and a second doping region 211 spaced apart from the gate electrode 207 and formed under the first doping region 208. The first doping region 208 has a lower concentration than that of the first doping region 208. The first and second doping regions 208 and 211 have the same conductivity type.

The transistor in accordance with a second exemplary embodiment of the present invention further includes a third doping region 203 formed under the first doping region 208 of the source and drain regions 212 and 213. The third doping region 203 is a halo region, and has a conductivity type different from the first and second doping regions 208 and 211. For example, when the transistor is formed of NMOS and the first and second doping regions 208 and 211 are n-type conductivity, the third doping region 203 has p-type conductivity.

FIGS. 6A and 6B are cross-sectional views showing a method of manufacturing the transistor shown in FIG. 5.

First, as shown in FIGS. 6A, a well 201, an isolation layer 202, and a third doping region 203 are formed through the same method as the first embodiment of the present invention described in FIG. 4A.

Next, an ion implantation mask is formed to partially expose a region in which the drive transistor of the CMOS image sensor is to be formed, specifically, a region in which the drain region 213 and the channel are to be formed. An ion implantation process using the ion implantation mask is performed to form the electric field attenuation region 204 on the interface of the substrate 200. The electric field attenuation region 204 is formed as n-type conductivity. Specifically, the electric field attenuation region 204 is formed at the interface of the substrate 200 with a low level of ion implantation energy $1\times10^{12}$ to $1\times10^{13}$ ions/cm$^2$ dose using arsenic ions that can be easily ion-implanted.

Next, as shown in FIG. 6B, a gate electrode 207 and a photo detection device 209 are formed.

Next, a first doping region of source and drain regions 212 and 213 are formed in the substrate 200 exposed to both sides of the gate electrode 207. The first doping region 208 is aligned with the gate electrode 207 and formed under the electric field attenuation region 204. The first doping region 208 has the same conductivity type as the electric field attenuation region 204, for example, n-type conductivity. In addition, the first doping region 208 has a higher concentration than that of the electric field attenuation region 204.

Next, spacers 210 may be formed on both sidewalls of the gate electrode 207.

Next, a second doping region 211 for source and drain regions 212 and 213 is formed under the first doping region 208 exposed to both sides of the gate electrode 207. When the spacers 210 are formed, the second doping region 211 is formed under the first doping region 208 exposed to both sides of the spacers 210. The second doping region 211 is formed of the same conductivity type as the first doping region 208, for example n-type conductivity. In addition, the second doping region 211 has a higher concentration than that of the first doping region 208.

The transistor specifically described through the embodiments 1 and 2 of the present invention may employ the drive transistor acting as a source follower, among the transistors constituting the unit pixel of the CMOS image sensor. As shown in FIG. 1, the gate electrode is connected to the floating diffusion region FD, and the drain region is connected to the power voltage terminal CDD so that the drive transistor Dx is operated according to charges accumulated in the floating diffusion region FD.

As described above, the more the charges are accumulated in the floating diffusion region FD, the more the difference in voltage between the gate electrode and the drain region of the drive transistor Dx is increase, generating a high electric field around the drain region. Such a high electric field promotes generation of secondary electrons (hot carrier) acting as dark current. The secondary electrons are introduced into the floating diffusion region FD and the photo detection device PD adjacent thereto. In severe cases, they generate light within a band of 400 to 1000 nm, and the light is introduced into the floating diffusion region FD and the photo detection device PD, causing image defects such as color or white dots on a screen.

Therefore, a relatively low concentration level of doping region is formed on the drain region of the drive transistor to overlap a portion of the gate electrode, like the embodiments 1 and 2 of the present invention. The low concentration doping region functions to attenuate the high electric field applied to the drain region. It is possible to reduce generation of secondary electrons and light within a visible light band due to the electric field attenuated (lowered) in the drain region by the low concentration doping region.

FIG. 7 is a view showing GIDL current between a transistor manufactured through the second exemplary embodiment and a transistor manufactured through the conventional manufacturing method. A GIDL test is performed under conditions that 0.1V or 3V is applied to the drain region and 0V is applied to the source region and the bulk of the transistor in accordance with a first exemplary embodiment of the present invention and the conventional transistor.

As a measurement result of the GIDL test shown in FIG. 7, it will be appreciated that the magnitude of GIDL current when a gate voltage VG is lower than 0V is remarkably lowered in the embodiment 2 more than the conventional art. Therefore, it can be indirectly confirmed that generation of the hot carrier is improved.

While the embodiments of the present invention have been described with reference to the drive transistor constituting the unit pixel of the CMOS image sensor, it is only for the convenience of understanding, and the embodiments may be applied to all semiconductor devices acting as source followers.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

Figure 1:
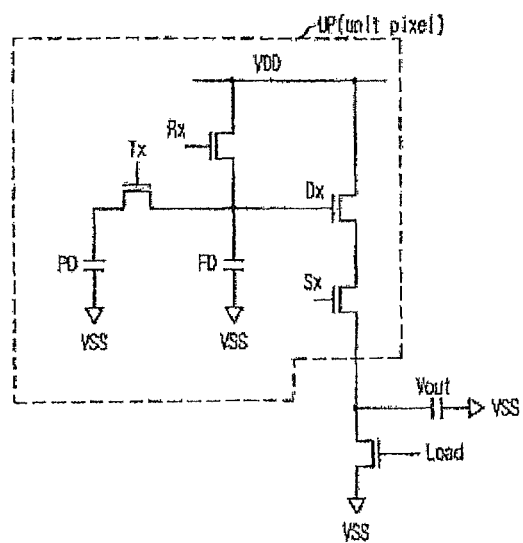
FIG. 1 is an equivalent circuit diagram of a unit pixel of a conventional CMOS image sensor.
Figure 2:
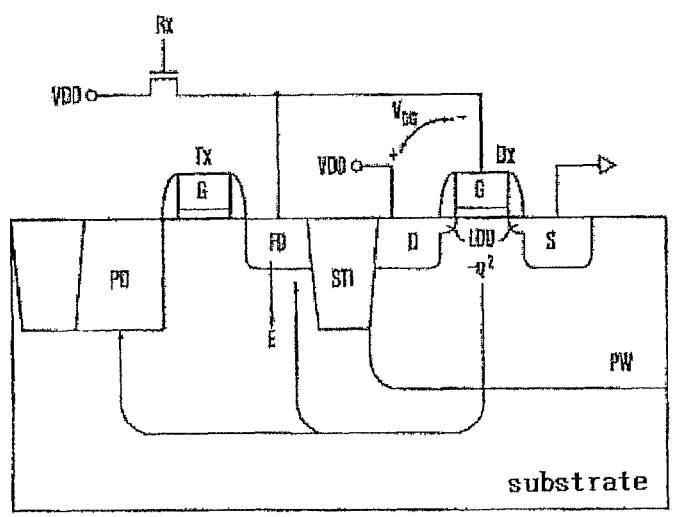
FIG. 2 is a cross-sectional view of several elements of the unit pixel shown in FIG. 1.
Figure 3:
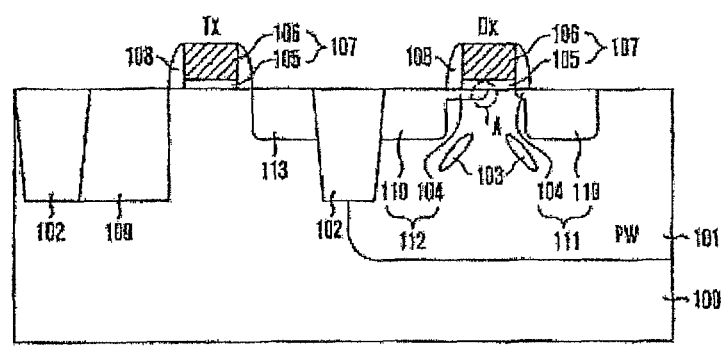
FIG. 3 is a cross-sectional view of a CMOS image sensor in accordance with a first exemplary embodiment of the present invention.
Figure 4A:
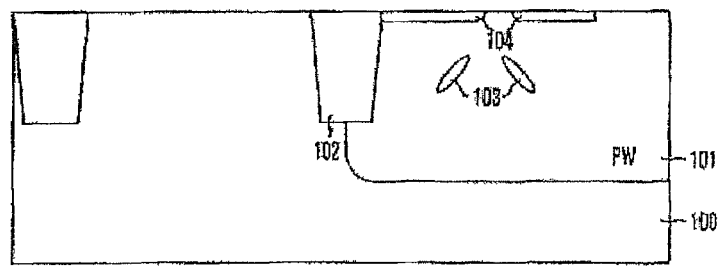
FIGS. 4A and 4B are cross-sectional views showing a method of manufacturing the CMOS image sensor shown in FIG. 3.
Figure 4B:
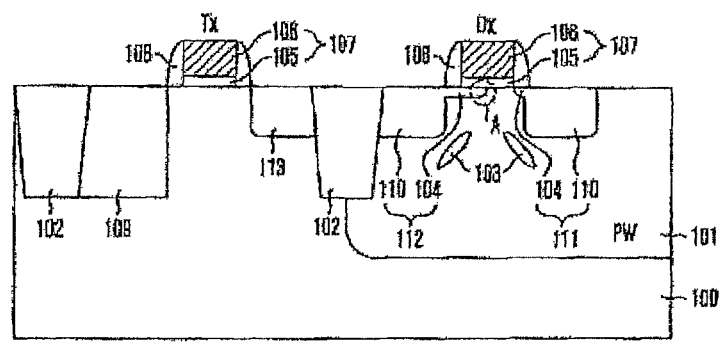
Figure 5:
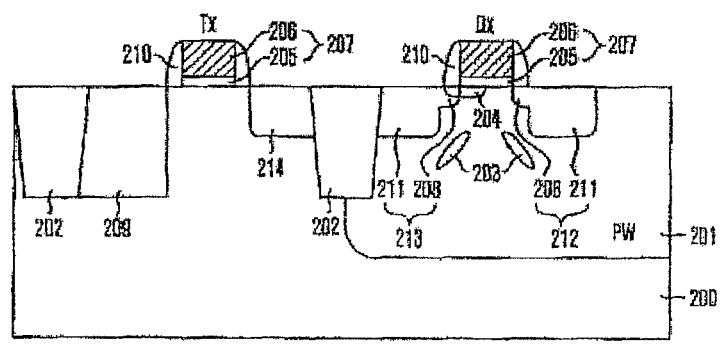
FIG. 5 is a cross-sectional view of a CMOS image sensor in accordance with a second exemplary embodiment of the present invention.
Figure 6A:
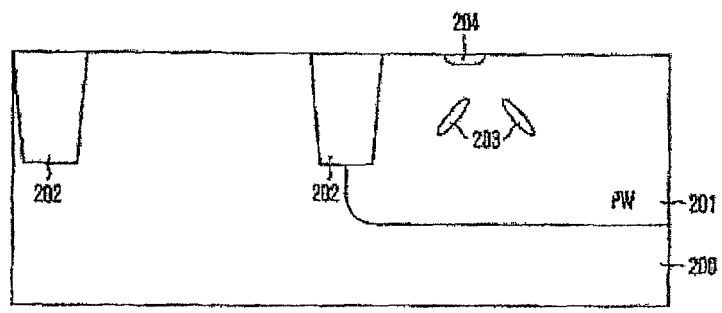
FIGS. 6A and 6B are cross-sectional views showing a method of manufacturing the CMOS image sensor shown in FIG. 5.
Figure 6B:
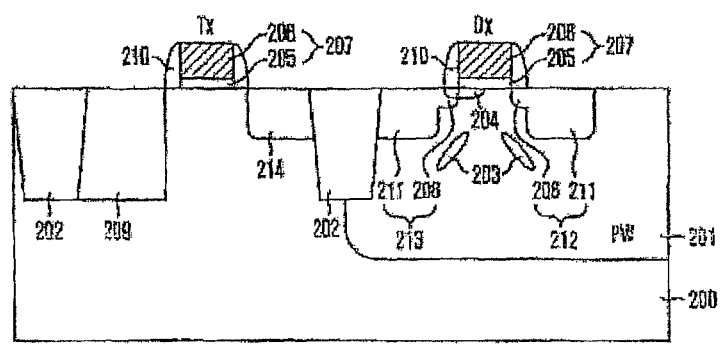
Figure 7:
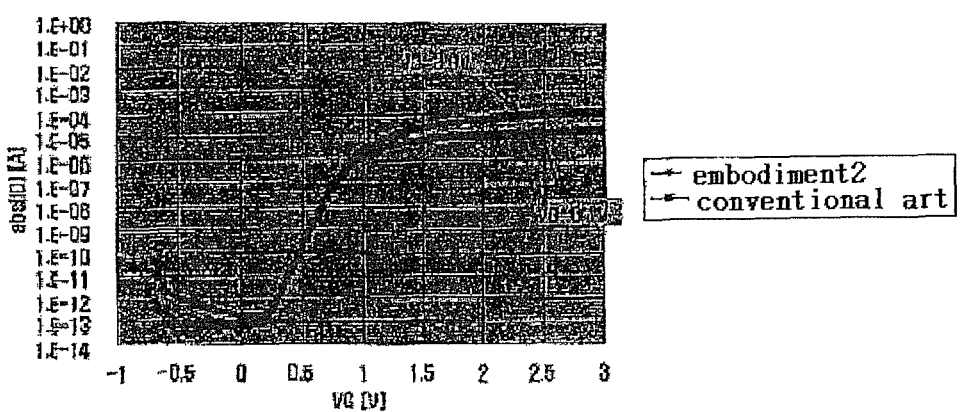
FIG. 7 is a view showing a gate induced drain leakage (GIDL) current between a transistor manufactured through the second exemplary embodiment and a transistor manufactured through the conventional manufacturing method.

DESCRIPTION OF MAJOR REFERENCE NUMERALS 100, 200: Substrate
101, 201: Shell
102, 202: Isolation layer
103, 203: Third doping region
104, 208: First doping region
105, 205: Gate insulating layer
106, 206: Gate conductive layer
107, 207: Gate electrode
108, 210: Spacer
109, 209: Photo detection device (photo diode)
110, 211: Second doping region
109, 209: Source region
112, 213: Drain region

The invention claimed is:
1. An image sensor, comprising:
   a photo detection device configured to gather photo-generated charge;
   a floating diffusion region;
   a transfer transistor configured to transfer photo-generated charge from the photo detection device to the floating diffusion region;
   a reset transistor configured to set a potential of the floating diffusion region to a desired value;

a drive transistor configured to generate a signal output representative of the potential of the floating diffusion region; and
a select transistor configured to transmit the signal output from the source region of the drive transistor,
wherein the drive transistor includes:
a gate electrode coupled to the floating diffusion region;
a source region disposed on a first side of the gate electrode,
wherein the source region comprises a first doping source region and a second doping source region, and the first doping source region extends toward a region under the gate electrode and away from the second doping source region;
a drain region coupled to a power voltage terminal and disposed on a second side of the gate electrode opposite the first side, wherein the drain region comprises a first doping drain region and a second doping drain region, and the first doping drain region extends toward the region under the gate electrode and further away from the second doping drain region than the first doping source region extends away from the second doping source region;
a doping region formed below the source region and having a conductivity type different than the source region; and
a doping region formed below the drain region and having a conductivity type different than the drain region.

2. The image sensor of claim 1, wherein:
the first doping drain region is formed at an interface of the substrate and partially overlaps the gate electrode; and
the second doping drain region is spaced apart from the gate electrode and is formed under the first doping drain region.

3. The image sensor of claim 2, wherein the first doping drain region has a lower concentration than that of the second doping drain region.

4. The image sensor of claim 2, wherein the first doping drain region and the second doping drain region have the same conductivity type.

5. The image sensor of claim 1, wherein:
the first doping source region is formed at an interface of the substrate and is aligned with the gate electrode; and
the second doping source region is spaced apart from the gate electrode and is formed under the first doping source region.

6. The image sensor of claim 5, wherein the first doping source region has a lower concentration than that of the second doping source region.

7. The image sensor of claim 5, wherein the first doping source region and the second doping source region have the same conductivity type.

8. The image sensor of claim 2, wherein the doping region formed below the drain region has a conductivity type different from the first doping drain region and the second doping drain region.

9. A method of manufacturing an image sensor, the method comprising:
forming a photo detection device to gather photo-generated charge;
forming a floating diffusion region;
forming a transfer transistor configured to transfer photo-generated charge from the photo detection device to the floating diffusion region; and
forming a drive transistor configured to generate a signal output representative of the potential of the floating diffusion region, wherein said forming a drive transistor includes:
forming source and drain regions in a substrate and spaced apart from each other;
forming a gate electrode on the substrate between the drain region and the source region; and
forming a doping region below the source region and another doping region below the drain region,
wherein said forming source and drain regions comprises:
forming a first doping source region and a second doping source region of the source region such that the first doping source region extends toward a region under the gate electrode and away from the second doping source region; and
forming a first doping drain region and a second doping drain region of the drain region such that the first doping drain region extends toward the region under the gate electrode and further away from the second doping drain region than the first doping source region extends away from the second doping source region.

10. The method of claim 9, wherein:
the first doping drain region has a lower concentration than that of the second doping drain region; and
the first doping source region has a lower concentration than that of the second doping source region.

11. The method of claim 9, wherein:
the first doping drain region and the second doping drain region have the same conductivity type; and
the first doping source region and the second doping source region have the same conductivity type.

12. The method of claim 11, wherein:
the doping region below the source region has a conductivity type different from the first doping source region and the second doping source region; and
the another doping region below the drain region has a conductivity type different from the first doping drain region and the second doping drain region.

13. The method of claim 9, wherein said forming a first doping drain region and a second doping drain region comprises:
forming the first doping drain region such that the first doping drain region partially overlaps the gate electrode; and
forming the second doping drain region under the first doping drain region.

14. The method of claim 9, wherein said forming a first doping source and second doping source region comprises:
forming the first doping source region such that the first doping source region does not overlap the gate electrode; and
forming the second doping source region under the first doping drain region.

15. The method of claim 9, wherein:
said forming a first doping source region and a second doping source region comprises forming the first doping source region such that the first doping source region does not overlap the gate electrode; and
said forming a first doping drain region and a second doping drain region comprises forming the first doping drain region such that the first doping drain region partially overlaps the gate electrode.

16. The method of claim 9, wherein:
said forming a first doping source region and a second doping source region comprises forming the first doping source region such that the first doping source region does not extend under the gate electrode; and said forming a first doping drain region and a second doping drain region comprises forming the first doping drain region such that the first doping drain region extends under the gate electrode.

17. The image sensor of claim 1, wherein:

the first doping source region does not overlap the gate electrode; and the first doping drain region partially overlaps the gate electrode.

18. The image sensor of claim 1, wherein:

the first doping source region does not extend under the gate electrode; and the first doping drain region extends under the gate electrode.

* * * * *